US012568856B2

(12) United States Patent
    Chiu

(10) Patent No.: US 12,568,856 B2
(45) Date of Patent: Mar. 3, 2026

(54) METHOD OF MANUFACTURING THREE-DIMENSIONAL SYSTEM-ON-CHIP AND THREE-DIMENSIONAL SYSTEM-ON-CHIP

(71) Applicant: Tzu-Wei Chiu, Zhubei (TW)

(72) Inventor: Tzu-Wei Chiu, Zhubei (TW)

( * ) Notice: Subject to any disclaimer, the term of this patent is extended or adjusted under 35 U.S.C. 154(b) by 671 days.

(21) Appl. No.: 17/740,461

(22) Filed: May 10, 2022

(65) Prior Publication Data

US 2022/0375918 A1 Nov. 24, 2022

(30) Foreign Application Priority Data

May 19, 2021 (TW) ................................. 110118108
Mar. 8, 2022 (TW) ................................. 111108350

(51) Int. Cl.
    *H01L 25/00* (2006.01)
    *H01L 21/02* (2006.01)
    (Continued)

(52) U.S. Cl.
    CPC ........ *H01L 25/50* (2013.01); *H01L 21/02164* (2013.01); *H01L 21/0217* (2013.01);
    (Continued)

(58) Field of Classification Search
    CPC ........ H01L 25/50; H01L 24/24; H01L 24/82; H01L 2224/24145; H01L 2924/1434;
    (Continued)

(56) References Cited

U.S. PATENT DOCUMENTS

2001/0039098 A1* 11/2001 Lu ..................... H01L 21/76243
                                                              438/517
2005/0023689 A1* 2/2005 Nicholson ........... H01L 21/7688
                                                              257/E21.583
(Continued)

FOREIGN PATENT DOCUMENTS

TW       201411751 A    3/2014
TW       201721828 A    6/2017
(Continued)

*Primary Examiner* — Julio J Maldonado
*Assistant Examiner* — Paul A Berry

(57) ABSTRACT

A method of manufacturing a three-dimensional system-on-chip, comprising providing a memory wafer structure with a first redistribution layer; disposing a first conductive structure and a core die structure and an input/output die structure with a second conductive structure on the first redistribution layer, the input/output die structure being disposed around the core die structure; forming a dielectric layer covering the core die structure, the input/output die structure, and the first conductive structure; removing a part of the dielectric layer and thinning the core die structure and a plurality of input/output die structures to expose the first and second conductive structures; forming a third redistribution layer on the dielectric layer, the third redistribution layer being electrically connected to the first and second conductive structures; forming a plurality of solder balls on the third redistribution layer; performing die saw. A three-dimensional system-on-chip is further provided.

9 Claims, 17 Drawing Sheets

(51) Int. Cl.
| | |
|---|---|
| *H01L 21/3105* | (2006.01) |
| *H01L 23/00* | (2006.01) |
| *H01L 25/065* | (2023.01) |

(52) U.S. Cl.
CPC .. *H01L 21/02255* (2013.01); *H01L 21/31053* (2013.01); *H01L 21/31055* (2013.01); *H01L 24/24* (2013.01); *H01L 24/82* (2013.01); *H01L 25/0652* (2013.01); *H01L 24/16* (2013.01); *H01L 2224/16225* (2013.01); *H01L 2224/24145* (2013.01); *H01L 2224/82896* (2013.01); *H01L 2924/1431* (2013.01); *H01L 2924/1434* (2013.01)

(58) Field of Classification Search
CPC .................... H01L 24/92; H01L 24/19; H01L 2224/08145; H01L 2224/73251; H01L 25/0652; H01L 24/73; H01L 24/94; H01L 21/56; H01L 21/561; H01L 25/18; H01L 21/70; H01L 25/00; H01L 2221/10; H01L 21/31053; H01L 21/033; H01L 21/31105; H01L 21/31127; H01L 21/31144; H01L 21/3143; H01L 21/76; H01L 21/762; H01L 21/306; H01L 21/31051; H01L 21/7684; H01L 21/02488; H01L 21/0332; H01L 21/3212; H01L 21/32115; H01L 2224/03616; H01L 2224/03845; H01L 2224/11616; H01L 22/26; H01L 21/2253; H01L 21/76859; H01L 21/76216–76218; H01L 21/76237; H01L 23/538–538; H01L 21/565–566; H01L 21/02164; H01L 21/0217; H01L 21/02255; H01L 21/76832; H01L 21/76243; H01L 2224/80896; H01L 2224/81896; H01L 24/96; H01L 24/97; H01L 24/95; H01L 2224/94; H01L 2224/96; H01L 2224/97; H10D 99/00; H10D 80/30
See application file for complete search history.

(56) References Cited

U.S. PATENT DOCUMENTS

| | | | | |
|---|---|---|---|---|
| 2010/0127345 | A1* | 5/2010 | Sanders | H01L 25/0652 |
| | | | | 438/109 |
| 2013/0070507 | A1* | 3/2013 | Yoon | G11C 7/106 |
| | | | | 365/189.011 |
| 2017/0148674 | A1* | 5/2017 | Lu | H01L 21/3212 |
| 2019/0244947 | A1* | 8/2019 | Yu | H01L 24/89 |
| 2021/0358825 | A1 | 11/2021 | Chen et al. | |
| 2021/0375819 | A1 | 12/2021 | Chen et al. | |

FOREIGN PATENT DOCUMENTS

| | | | |
|---|---|---|---|
| TW | 202121641 A | 6/2021 | |
| WO | WO-2015013162 A1 * | 1/2015 | ....... H01L 21/31053 |

* cited by examiner

METHOD OF MANUFACTURING THREE-DIMENSIONAL SYSTEM-ON-CHIP AND THREE-DIMENSIONAL SYSTEM-ON-CHIP

FIELD OF THE INVENTION

The present invention relates to a method of manufacturing a semiconductor structure, and more particularly to a method of manufacturing a three-dimensional (3D) system-on-chip (SoC) and a three-dimensional system-on-chip.

BACKGROUND OF THE INVENTION

With the vigorous development of the electronic industry, electronic products have gradually entered multi-functional and high-performance research and development, where semiconductor technology has been widely applied in manufacturing chipsets such as memory and central processing units. In order to achieve high integration and high speed, the size of semiconductor integrated circuits has been continuously reduced, and a variety of materials and technologies have been developed currently to achieve the above-mentioned integration and speed requirements.

Generally, multiple devices/components (e.g., transistors, diodes, etc.) are designed and embedded in integrated circuit (IC) chips which are then placed in packages (e.g., plastic casings) or used as bare chips to be placed on printed circuit boards (PCBs) of electronic devices. In addition to traditional technology node miniaturization at a transistor level, three-dimensional (3D) IC chip stacking is increasingly being utilized to continue using current semiconductor manufacturing technologies to create three-dimensional system-on-chip (3D SoC) devices and to provide solutions to meet the performance, power and bandwidth requirements of various electronic devices. 3D SoC devices can include several logic, memory, analogs or other chips of different technology nodes, and how to stack logic, memory, analogs and other chips to form three-dimensional system-on-chips has become a target of much-needed research in current related fields.

SUMMARY OF THE INVENTION

The present invention provides a method of manufacturing a 3D SoC and a 3D SoC, so that the 3D SoC can meet the requirements of high integration and speed, thus having better electrical characteristics and efficiency.

The method of manufacturing a three-dimensional system-on-chip provided by the present invention includes: providing a memory wafer structure, including a wafer, a first active layer and a first redistribution layer, the first active layer being formed on the wafer, and the first redistribution layer being formed on the first active layer; disposing a plurality of first conductive structures, a core die structure, and a plurality of input/output die structures on the first redistribution layer, where the plurality of input/output die structures are disposed around the core die structure, where each of the core die structure and each of the plurality of input/output die structures include a semiconductor substrate, a stop layer structure, a second active layer, a plurality of second conductive structures, and a second redistribution layer, the semiconductor substrate has opposite active side and back side, and the stop layer structure is formed in the semiconductor substrate, dividing the semiconductor substrate into a first substrate part and a second substrate part, where the first substrate part is located between the stop layer structure and the active side, and the second substrate part is located between the stop layer structure and the back side, the second active layer is formed on the active side, the plurality of second conductive structures are formed in the first substrate part to connect the second active layer and the stop layer structure, the second redistribution layer is formed on the second active layer, and the second redistribution layer of each of the core die structure and the second redistribution layer of each of the plurality of input/output die structures are bonded to the first redistribution layer; performing a backside grinding process of grinding from the back side of the semiconductor substrate to remove a part of the second substrate part; performing a dielectric filling process to form a dielectric layer covering the core die structure, the plurality of input/output die structures, and the plurality of first conductive structures; performing a thinning process of removing a part of the dielectric layer, a remaining part of the second substrate part, and a part of the stop layer structure to expose the plurality of first conductive structures and the plurality of second conductive structures; forming a third redistribution layer on the dielectric layer, the third redistribution layer being electrically connected to the exposed first conductive structures and the exposed second conductive structures; forming a plurality of solder balls on the third redistribution layer; and performing die saw.

The method of manufacturing a three-dimensional system-on-chip provided by the present invention includes: providing a memory wafer structure, including a wafer, a first active layer and a first redistribution layer, the first active layer being formed on the wafer, and the first redistribution layer being formed on the first active layer; providing an SoC wafer structure, divided into an independent core die area and a plurality of input/output die areas, the plurality of input/output die areas being disposed around the core die area, the SoC wafer structure including a semiconductor wafer, a stop layer structure, a second active layer, a plurality of conductive structures, and a second redistribution layer, the semiconductor wafer having opposite active side and back side, the stop layer structure being formed in the semiconductor wafer, dividing the semiconductor wafer into a first wafer part and a second wafer part, where the first wafer part is located between the stop layer structure and the active side, and the second wafer part is located between the stop layer structure and the back side, the second active layer being formed on the active side, the plurality of conductive structures being formed in the first wafer part to connect the second active layer and the stop layer structure, and the second redistribution layer being formed on the second active layer; bonding the first redistribution layer of the memory wafer structure to the second redistribution layer of the SoC wafer structure; performing a backside grinding process of grinding from the back side of the semiconductor wafer to remove a part of the second wafer part; performing a thinning process of removing a remaining part of the second wafer part and a part of the stop layer structure to expose the plurality of conductive structures; forming a third redistribution layer on the first wafer part, the third redistribution layer being electrically connected to the exposed conductive structures; forming a plurality of solder balls on the third redistribution layer; and performing die saw.

In an embodiment of the present invention, the stop layer structure includes a first stop layer and a second stop layer stacked on each other, a material from which the first stop layer is made is different from a material from which the second stop layer is made, the second stop layer is between the first stop layer and the second active layer, and during the thinning process, the step of removing a part of the stop layer structure includes first removing the first stop layer, and then removing a part of the second stop layer.

In an embodiment of the present invention, the first stop layer is a silicon nitride layer, and the second stop layer is a silicon dioxide layer.

In an embodiment of the present invention, a step of forming the silicon nitride layer and the silicon dioxide layer includes first performing a nitrogen ion implantation process at a first depth of the semiconductor substrate (semiconductor wafer), then performing an oxygen ion implantation process at a second depth of the semiconductor substrate (semiconductor wafer), and the second depth is smaller than the first depth, and then a high temperature processing process is performed, so that the silicon nitride layer is formed in an area of the nitrogen ion implantation, and the silicon dioxide layer is formed in an area of the oxygen ion implantation.

In an embodiment of the present invention, a method of removing the silicon nitride layer and the silicon dioxide layer is selected from one of chemical mechanical polishing and plasma dry etching, where a selection ratio of silicon nitride and silicon dioxide is between 10 and 20, and a selection ratio of silicon dioxide and silicon is about 5.

In an embodiment of the present invention, the thinning process includes: a first removing step of removing a part of the dielectric layer and a remaining part of the second substrate part (the second wafer part); and a second removing step of removing a part of the stop layer structure to expose the plurality of second conductive structures (conductive structures).

In an embodiment of the present invention, the first removing step is selected from one of chemical mechanical polishing, wet etching and plasma dry etching, and the second removing step is selected from one of chemical mechanical polishing and plasma dry etching.

In an embodiment of the present invention, the second redistribution layer is bonded to the first redistribution layer by a hybrid bonding technique.

The three-dimensional system-on-chip provided by the present invention includes a memory chip structure, a plurality of first conductive structures, a core die, a plurality of input/output dies, a dielectric layer, a third redistribution layer, and a plurality of solder balls. The memory chip structure includes a semiconductor substrate, a first active layer and a first redistribution layer, the first active layer is formed on the semiconductor substrate, and the first redistribution layer is formed on the first active layer; the plurality of first conductive structures, the core die and the plurality of input/output dies are disposed on the first redistribution layer, where the plurality of input/output dies are disposed around the core die, where the core die and the plurality of input/output dies include a substrate, a stop layer structure, a second active layer, a plurality of second conductive structures, and a second redistribution layer, the second active layer and the stop layer are respectively disposed on opposite sides of the substrate, the plurality of second conductive structures are formed in the substrate, and an end of each of the plurality of second conductive structures is connected to the second active layer, the other end of each of the plurality of second conductive structures penetrates and is exposed to the stop layer structure, the second redistribution layer is formed on the second active layer, and the second redistribution layer of the core die area and the second redistribution layer of the plurality of input/output die areas are bonded to the first redistribution layer; the dielectric layer is filled between the core die, the plurality of input/output dies, and the plurality of first conductive structures, and exposes the stop layer structure and an end of the plurality of first conductive structures; the third redistribution layer is formed on the dielectric layer, and the third redistribution layer is electrically connected to the exposed first conductive structures and the exposed second conductive structures; the plurality of solder balls are formed on the third redistribution layer.

The three-dimensional system-on-chip provided by the present invention includes a memory chip structure, an SoC chip, a third redistribution layer, and solder balls. The memory chip structure includes a semiconductor substrate, a first active layer and a first redistribution layer, the first active layer is formed on the semiconductor substrate, and the first redistribution layer is formed on the first active layer; the SoC chip is divided into an independent core die and a plurality of input/output dies, the plurality of input/output dies are disposed around the core die, the SoC chip includes a substrate, a stop layer structure, a second active layer, a plurality of conductive structures, and a second redistribution layer, the second active layer and the stop layer structure are respectively disposed on opposite sides of the substrate, the plurality of conductive structures are formed in the substrate, an end of each of the plurality of conductive structures is connected to the second active layer, the other end of each of the plurality of conductive structures penetrates and is exposed to the stop layer structure, the second redistribution layer is formed on the second active layer, and the first redistribution layer of each of the plurality of memory chip structures is bonded to the second redistribution layer of the core die; the third redistribution layer is formed on the stop layer structure, and the third redistribution layer is electrically connected to the exposed conductive structures; the solder balls are formed on the third redistribution layer.

In the three-dimensional system-on-chip of the present invention, a memory chip can be bonded to a core die and a plurality of input/output dies covered by a dielectric layer, or the memory chip and the SoC chip are bonded to each other. The core die, the plurality of input/output dies, or the SoC chip can be thinned to have a very thin thickness by disposing the stop layer structure, so that the overall thickness of the three-dimensional system-on-chip is greatly reduced, which can meet the requirements of high integration and speed, thus having better electrical characteristics and efficiency.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The present invention will become more readily apparent to those ordinarily skilled in the art after reviewing the following detailed description and accompanying drawings, in which:

FIG. 1A to FIG. 1I are schematic cross-sectional views of a method of manufacturing a three-dimensional system-on-chip, according to a first embodiment of the present invention;

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
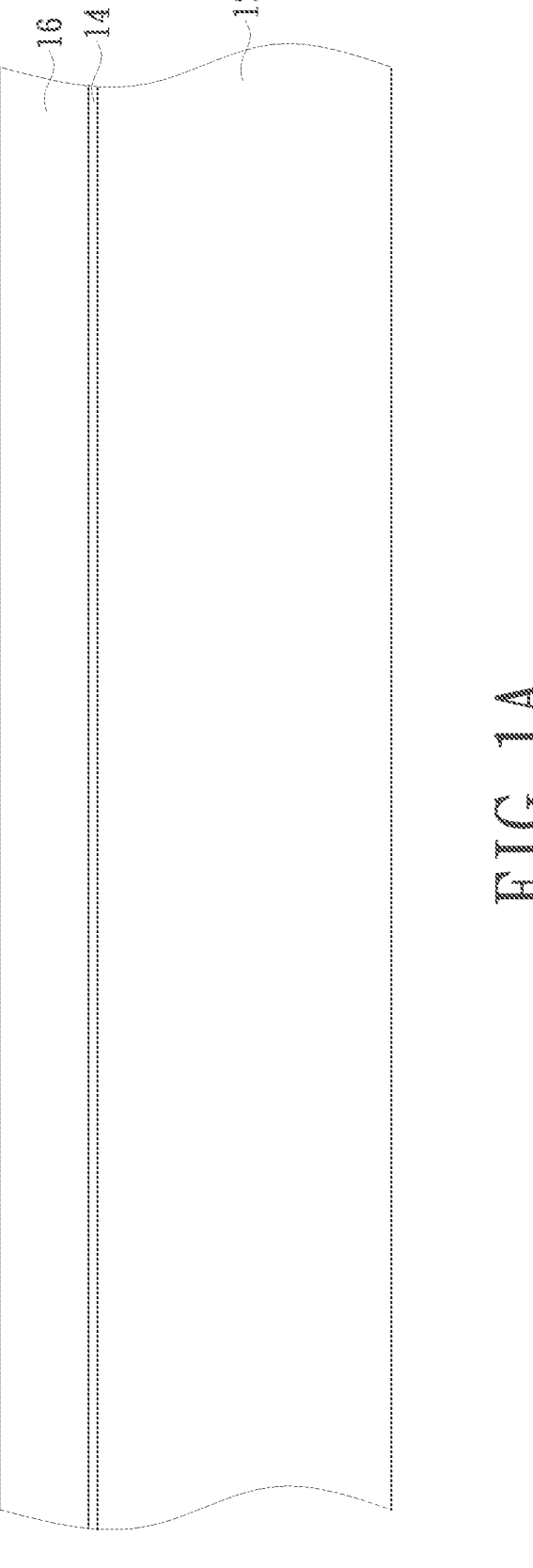

FIG. 1A to FIG. 1I are schematic cross-sectional views of a method of manufacturing a three-dimensional system-on-chip according to a first embodiment of the present invention. As shown in FIG. 1A, a memory wafer structure 10 including a wafer 12, a first active layer 14 and a first redistribution layer 16 is provided, wherein the first active layer 14 is formed on the wafer 12, and the first redistribution layer 16 is formed on the first active layer 14. In an embodiment, the wafer 12 is, for example, a silicon wafer, an epitaxial silicon wafer, a silicon germanium wafer, or a silicon carbide wafer; on the first active layer 14, for example, basic devices of memory such as transistor devices are formed; on the first redistribution layer 16, for example, metal wirings, metal plugs (vias) and microbumps are formed.

Figure 1B:
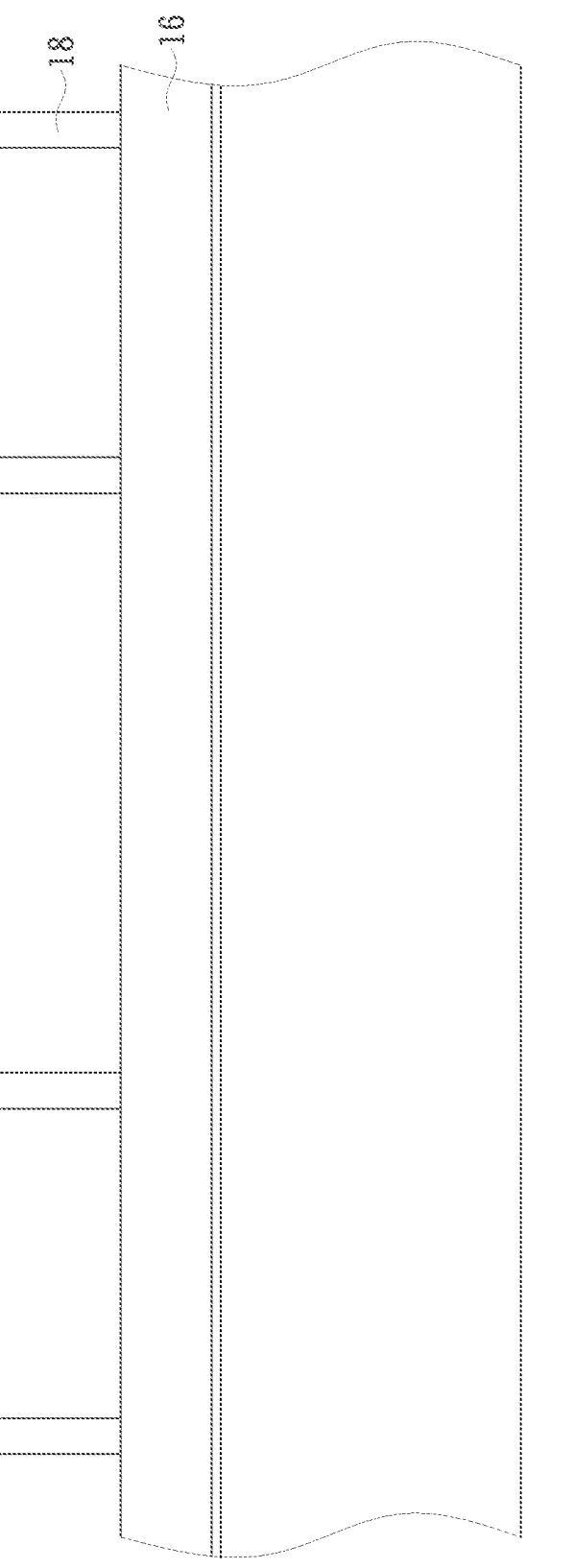
Figure 1C:
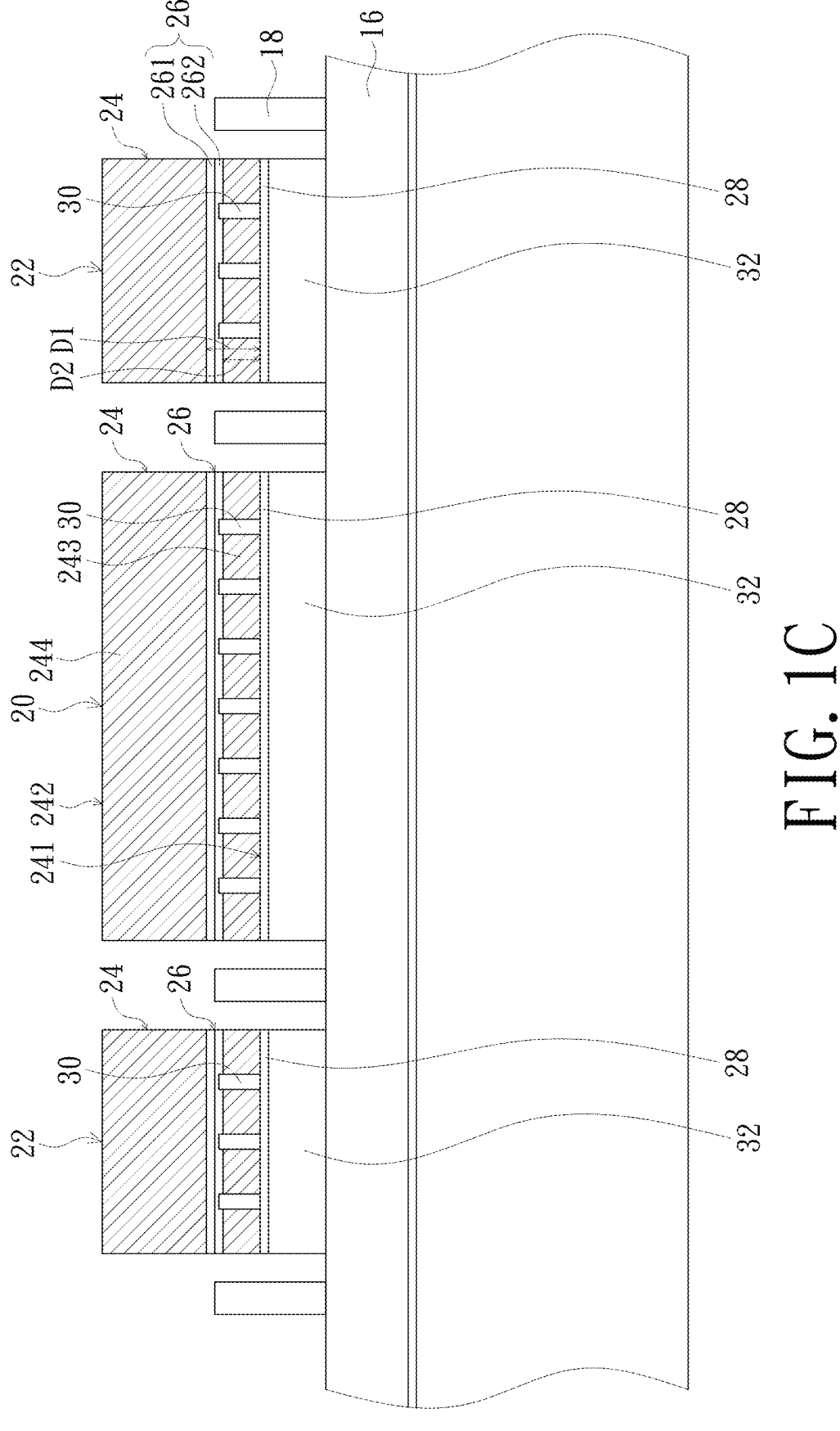

As shown in FIG. 1B, a plurality of first conductive structures 18 are disposed on the first redistribution layer 16, and the plurality of first conductive structures 18 are, for example, conductive pillars; as shown in FIG. 1C, a core die structure 20 and a plurality of input/output (I/O) die structures 22 are disposed on the first redistribution layer 16, where the plurality of I/O die structures 22 are disposed around the core die structure 20, and the plurality of first conductive structures 18 are between the plurality of I/O die structures 22 and the core die structure 20. The structure and configuration of each core die structure 20 and each I/O die structure 22 are substantially the same. The difference between the two is mainly the different configurations of electric components in active layers of the core die structure 20 and the I/O die structures 22, so the corresponding or identical structures in the core die structure 20 and the I/O die structures 22 are denoted by the same reference numerals below.

Please continue to refer to FIG. 1C, the core die structure 20 and each I/O die structure 22 include a semiconductor substrate 24, a stop layer structure 26, a second active layer 28, a plurality of second conductive structures 30, and a second redistribution layer 32, wherein the semiconductor substrate 24 has an active side 241 and a back side 242 opposite to each other, and the stop layer structure 26 is formed in the semiconductor substrate 24, dividing the semiconductor substrate 24 into a first substrate part 243 and a second substrate part 244, where portion of the semiconductor substrate 24 between the stop layer structure 26 and the active side 241 is referred to as the first substrate part 243, and portion of the semiconductor substrate 24 between the stop layer structure 26 and the back side 242 is referred to as the second substrate part 244, so the first substrate part 243 is located between the stop layer structure 26 and the active side 241, and the second substrate part 244 is located between the stop layer structure 26 and the back side 242. The second active layer 28 is formed on the active side 241. In an embodiment, for example, electric components such as metal oxide semiconductors (MOSs) are formed on/in the second active layer 28. A plurality of second conductive structures 30 are formed in the first substrate part 243 to connect the second active layer 28 and the stop layer structure 26. In an embodiment, the plurality of second conductive structures 30 are, for example, conductive pillars. The second redistribution layer 32 is formed on the second active layer 28, and wherein the metal wirings, the metal plugs (vias) and the microbumps, for example, are formed on/in the second redistribution layer 32. As shown in FIG. 1C, in an embodiment, the second redistribution layer 32 of the core die structure 20 and the second redistribution layer 32 of each I/O die structure 22 are bonded to the first redistribution layer 16 by a hybrid bonding technique.

In an embodiment, the stop layer structure 26 includes a first stop layer 261 and a second stop layer 262 stacked on each other, a material from which the first stop layer 261 is made is different from a material from which the second stop layer 262 is made, and the second stop layer 262 is between the first stop layer 261 and the second active layer 28, where the first stop layer 261 is, for example, a silicon nitride $(Si_3N_4)$ layer, and the second stop layer 262 is, for example, a silicon dioxide $(SiO_2)$ layer. A method of manufacturing the stop layer structure 26 includes performing an ion implantation process and a high temperature processing process, where the ion implantation process includes first performing a nitrogen ion implantation process at a first depth D1 of the semiconductor substrate 24 from the active side 241, and then performing an oxygen ion implantation process at a second depth D2 of the semiconductor substrate 24 from the active side 241, and the second depth D2 of an oxygen ion implantation area is smaller than the first depth D1 of a nitrogen ion implantation area, that is, the oxygen ion implantation area is closer to the active side 241. Then high temperature processing is performed to form a silicon nitride layer (i.e. the first stop layer 261) in the nitrogen ion implantation area, and to form a silicon dioxide layer (i.e. the second stop layer 262) in the oxygen ion implantation area, where the second stop layer 262 is closer to the active side 241, and the first stop layer 261 is closer to the back side 242.

Figure 1D:
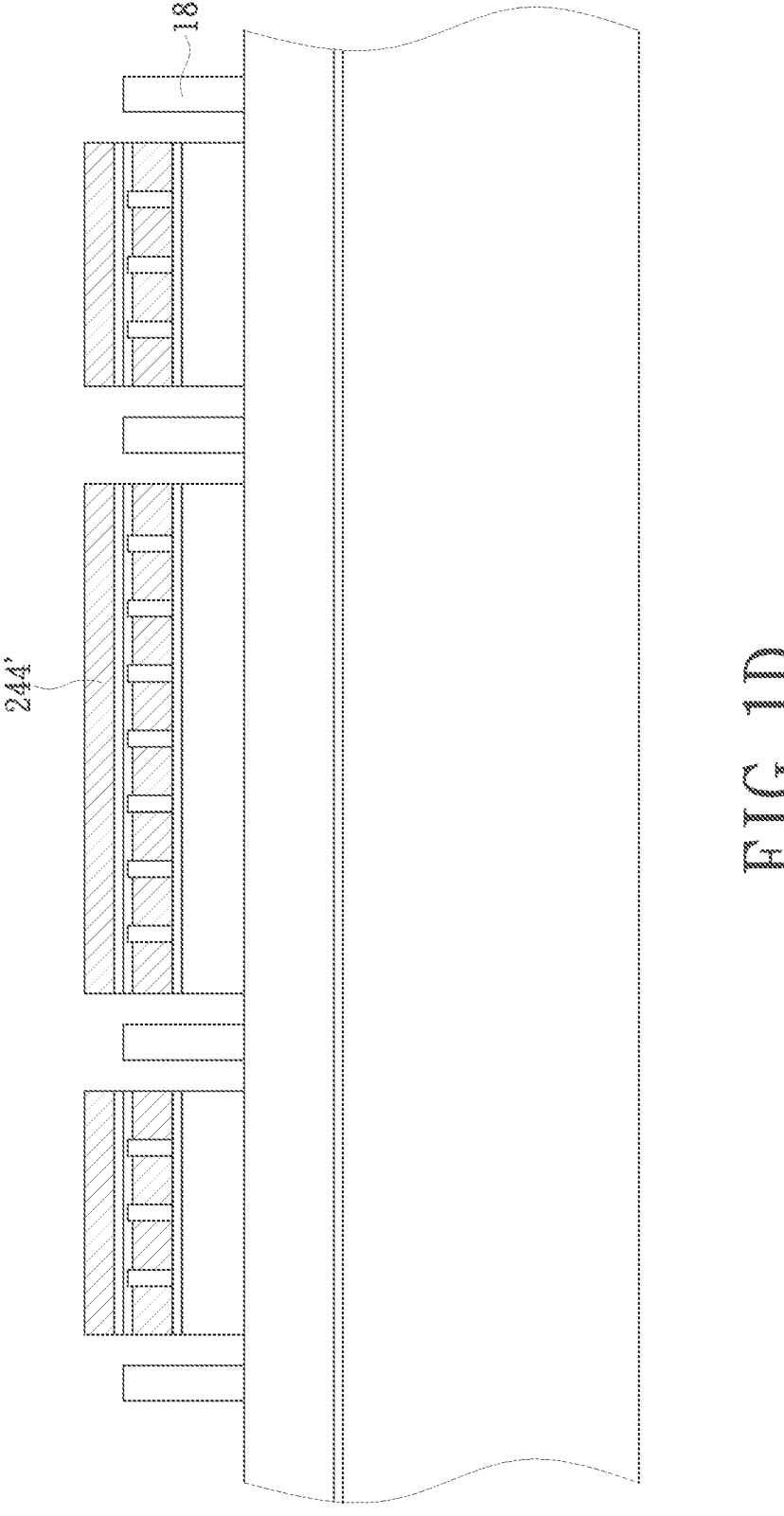

As shown in FIGS. 1C and 1D, a backside grinding process of grinding from the back side 242 of the semiconductor substrate 24 is performed to remove a part of the second substrate part 244, and as shown in FIG. 1D, a very thin second substrate part 244' remains.

Figure 1E:
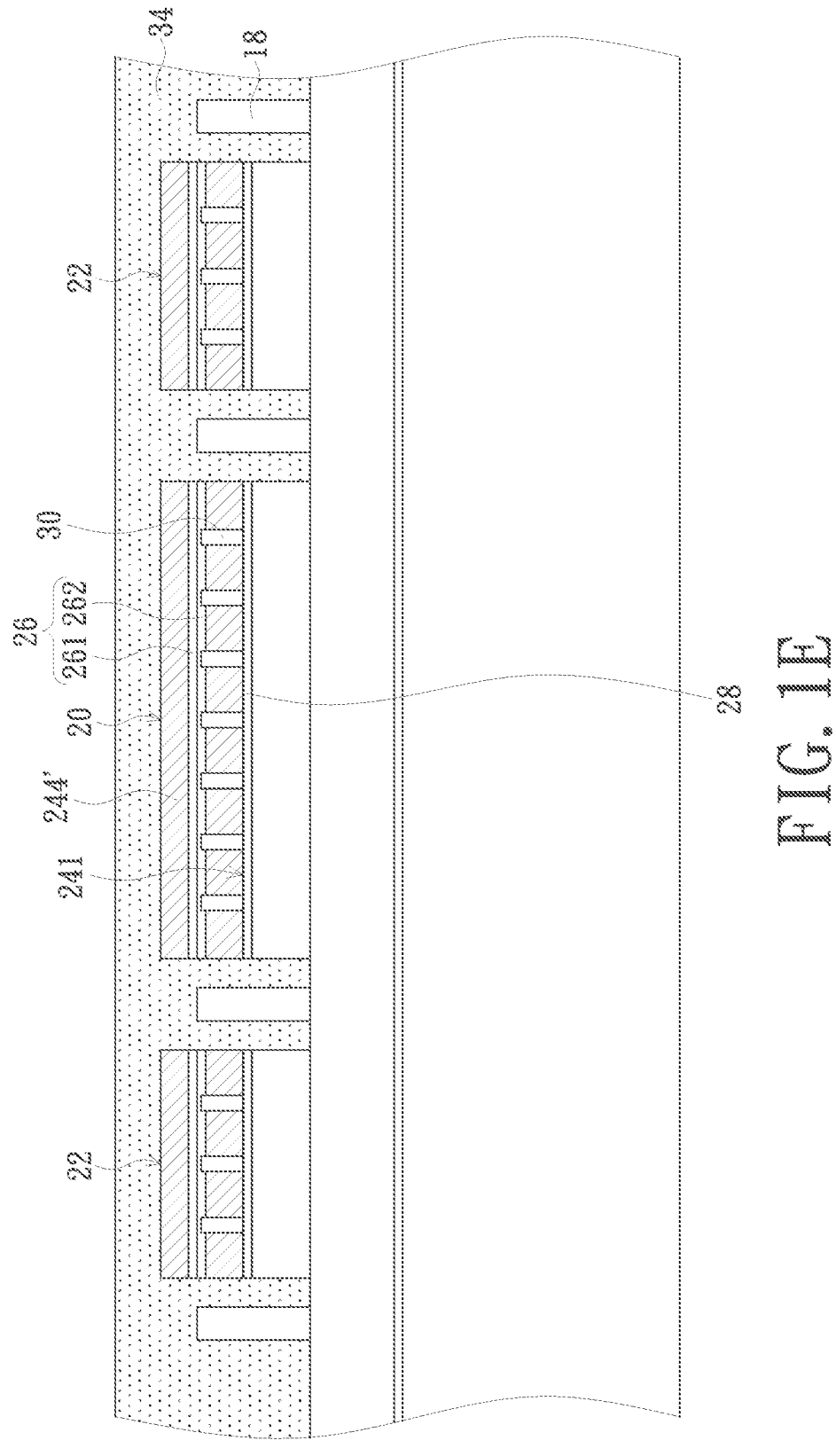
Figure 1F:
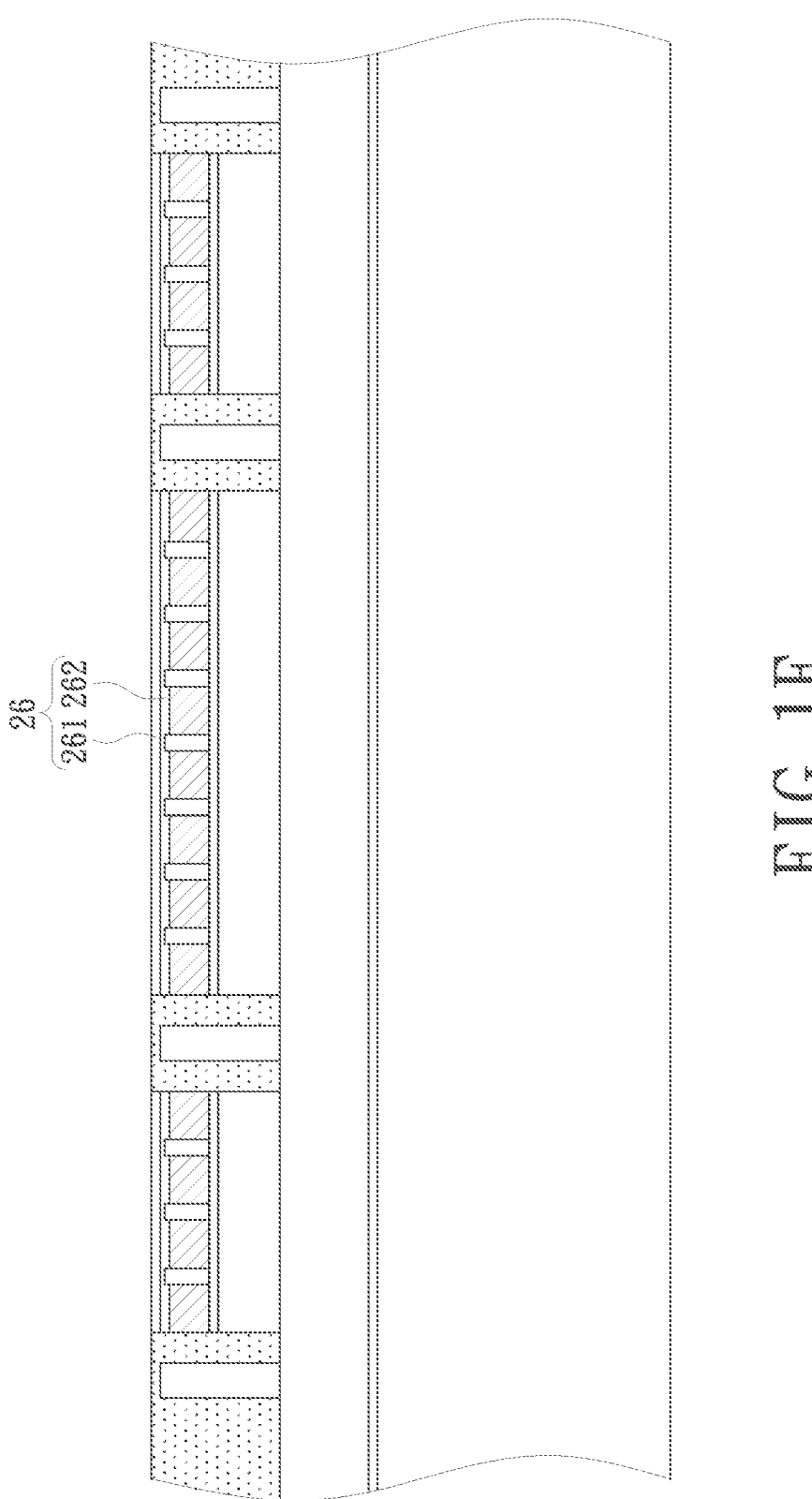

As shown in FIG. 1E, a dielectric filling process is performed to form a dielectric layer 34 covering the core die structure 20, the I/O die structures 22, and the first conductive structures 18. Next, a thinning process of removing a part of the dielectric layer 34, a remaining part of the second substrate part 244' and a part of the stop layer structure 26 is performed to expose the first conductive structures 18 and the second conductive structures 30. In an embodiment, the thinning process includes a first removing step and a second removing step, the first removing step is used to remove a remaining part of the second substrate part 244' and a part of the dielectric layer 34, as shown in FIG. 1F, to expose the stop layer structure 26, for example, to expose the first stop layer 261, and the first removing step is, for example, a process selected from one of chemical mechanical polishing, wet etching and plasma dry etching. In an embodiment, a material of the second substrate part 244' is silicon, and a material of the first stop layer 261 is silicon nitride, and when the chemical mechanical polishing process is used for the first removing step, a selection ratio of silicon and silicon nitride is 20, that is, $Si/Si_3N_4$ is 20.

Figure 1G:
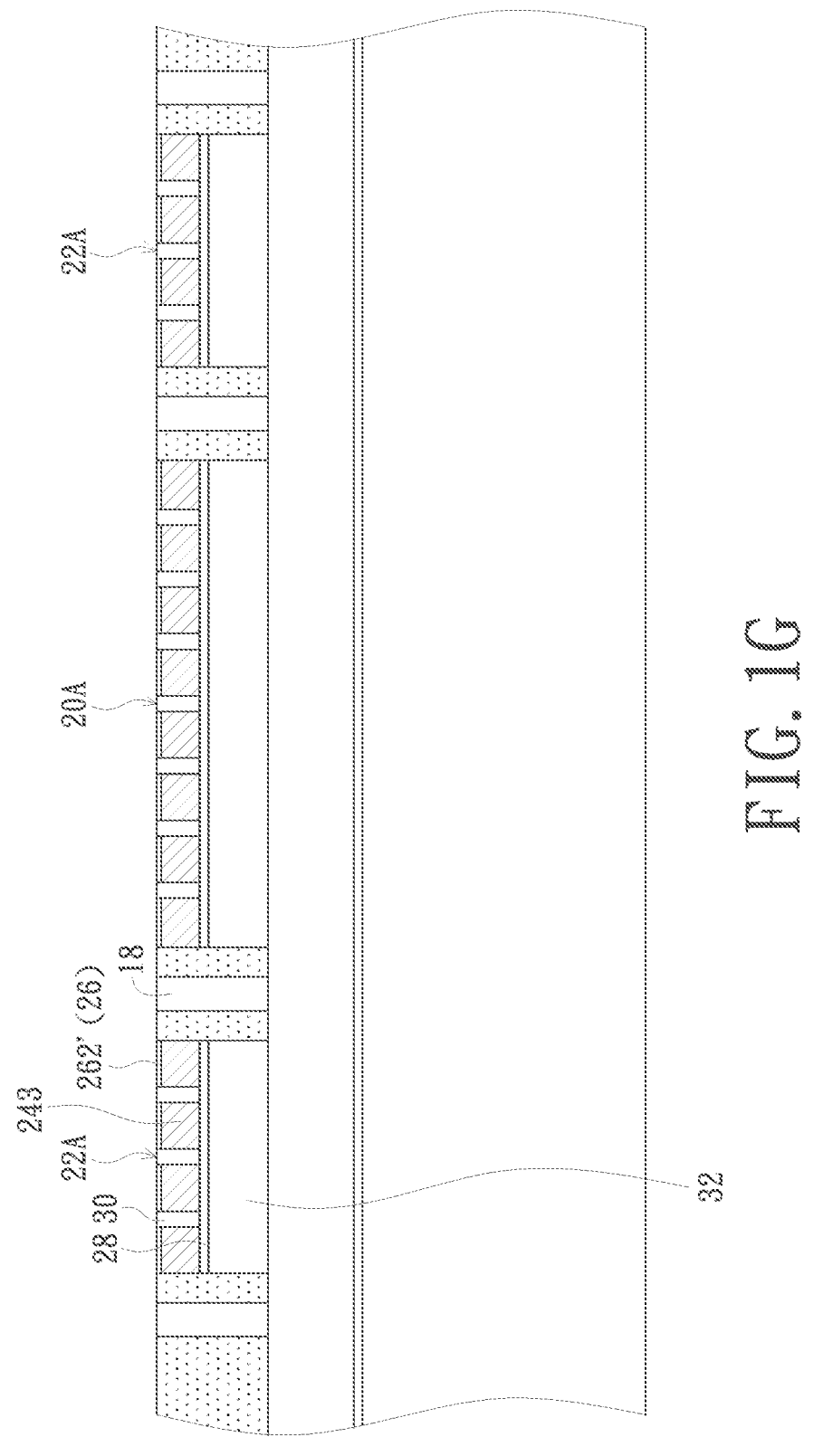

Continuing the above description, the second removing step is used to remove a part of the stop layer structure 26, that is, to remove the first stop layer 261 and a part of the second stop layer 262 in sequence, as shown in FIG. 1G, to expose the plurality of first conductive structures 18 and the plurality of second conductive structures 30, and the second removing step is, for example, a process selected from one of chemical mechanical polishing and plasma dry etching. In an embodiment, the first stop layer 261 is, for example, a silicon nitride ($Si_3N_4$) layer, and the second stop layer 262 is, for example, a silicon dioxide ($SiO_2$) layer. In the second removing step, the silicon nitride layer (the first stop layer 261) is first removed by chemical mechanical polishing to expose the silicon dioxide layer (the second stop layer 262), where a selection ratio of silicon nitride and silicon dioxide is, for example, between 10 and 20, that is, $Si_3N_4/SiO_2$ is between 10 and 20; and then another chemical mechanical polishing process is used to remove a part of the silicon dioxide layer (the second stop layer 262) to leave a very thin silicon dioxide layer (second stop layer 262') and expose the first conductive structures 18 and the second conductive structures 30, where a selection ratio of silicon dioxide and silicon is about 5, that is, $SiO_2/Si$ is 5. In this way, both the core die structure 20 (shown in FIG. 1E) and the I/O die structures 22 (shown in FIG. 1E) are thinned, and the thinned core die structure 20 and the thinned I/O die structures 22, for example, are referred to as a core die 20A and I/O dies 22A, respectively.

Specifically, the core die 20A and the I/O dies 22A include a substrate (i.e. the first substrate part 243), a remaining second stop layer 262' of the stop layer structure 26, the second active layer 28, the second conductive structures 30, and the second redistribution layer 32, wherein the second active layer 28 and the second stop layer 262' are respectively disposed on opposite sides of the substrate (i.e. the first substrate part 243), the second conductive structures 30 is formed in the substrate (i.e. the first substrate part 243), an end of each second conductive structure 30 is connected to the second active layer 28, the other end of each second conductive structure 30 penetrates and is exposed to the second stop layer 262', and the second redistribution layer 32 is formed on the second active layer 28.

Figure 1H:
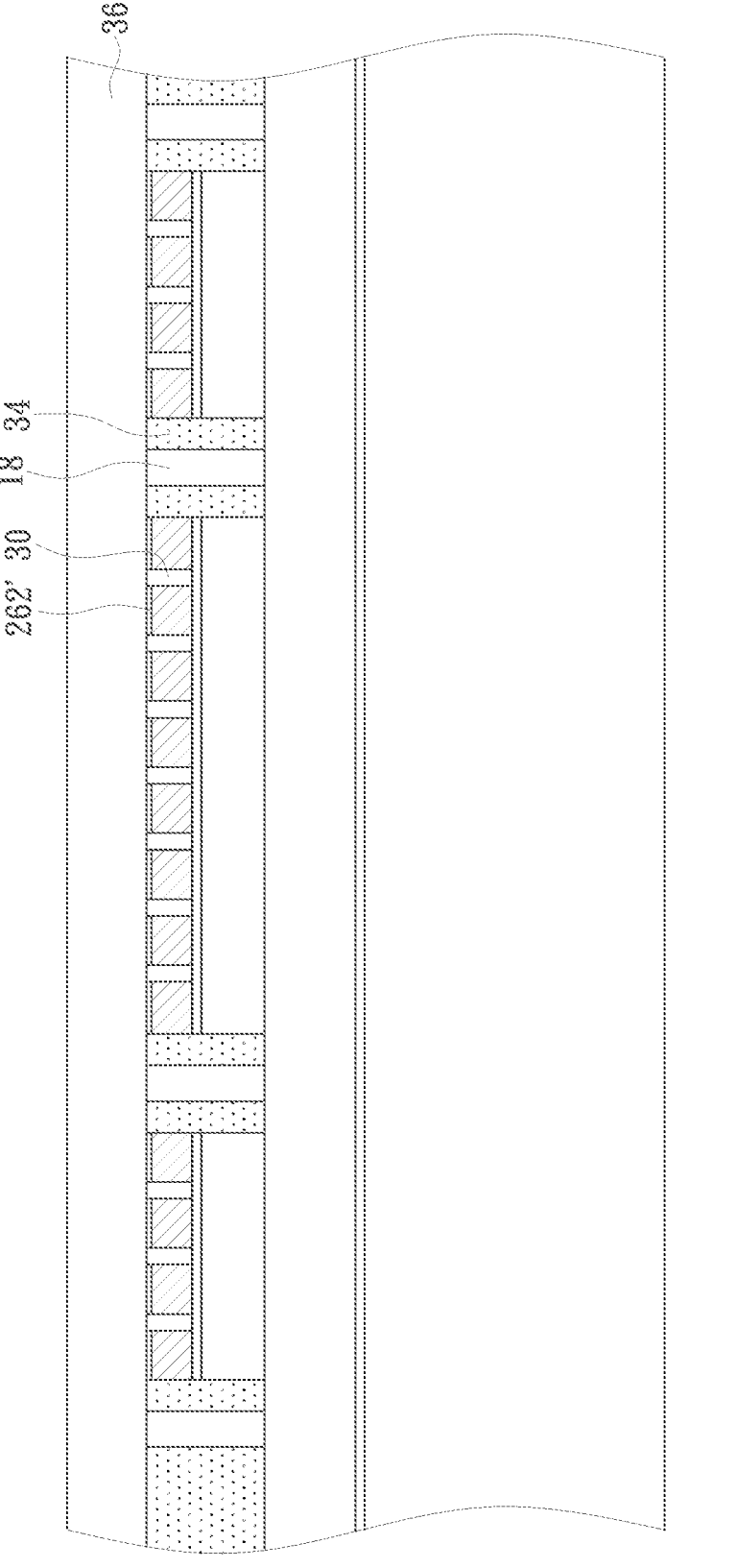
Figure 11:
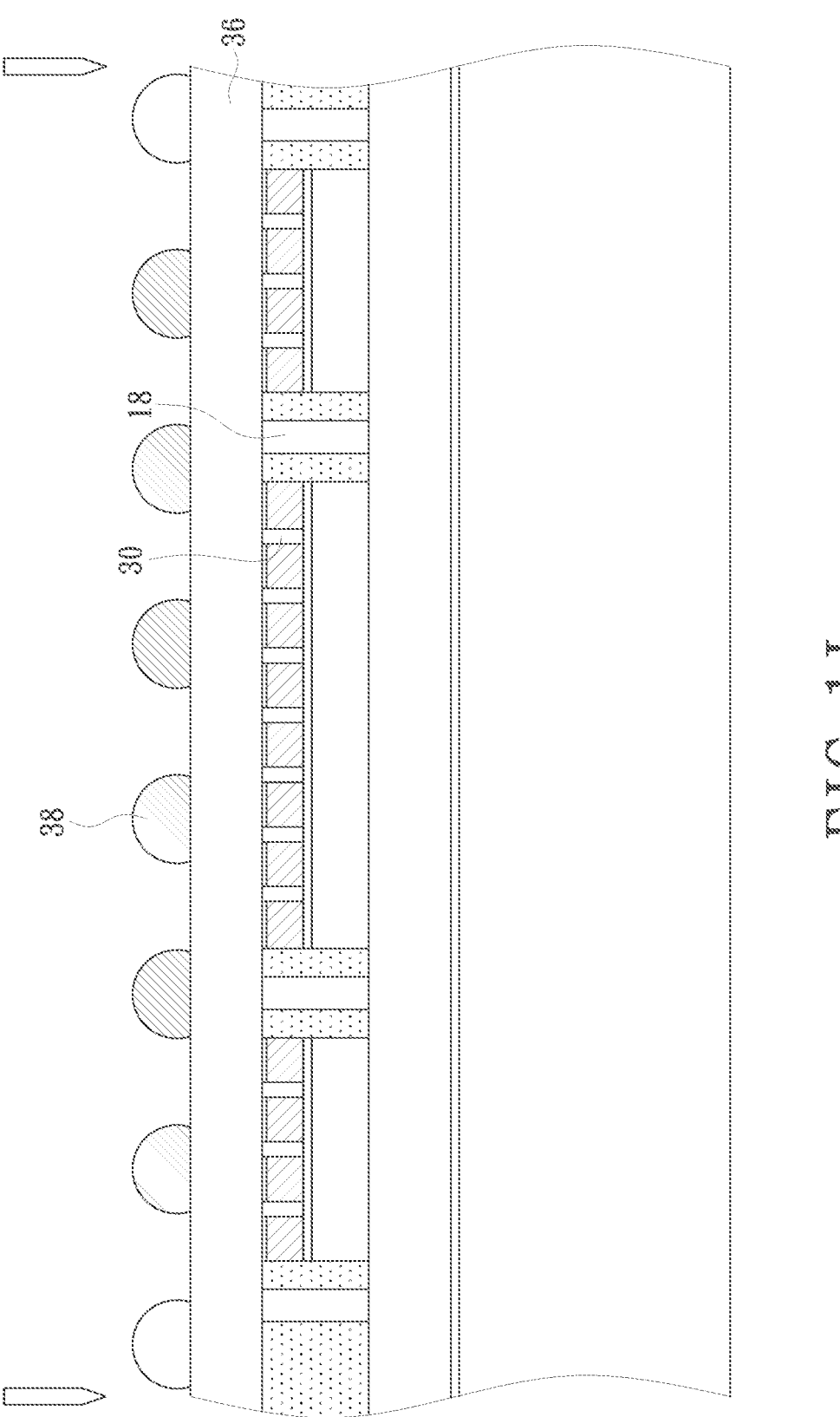

As shown in FIG. 1H, the third redistribution layer 36 is formed on the dielectric layer 34 and the partially remaining and extremely thin second stop layer 262', and the third redistribution layer 36 is electrically connected to the first conductive structures 18 and the exposed second conductive structures 30, where there is better adhesion between the third redistribution layer 36 and the second stop layer 262', so the third redistribution layer 36 is not easy to peel off. As shown in FIG. 1I, a plurality of solder balls 38 are formed on the third redistribution layer 36. In an embodiment, the solder balls 38 are respectively electrically connected to, for example, the first conductive structures 18 and the second conductive structures 30 by the third redistribution layer 36; then, after chip probing (CP) to perform an electrical function test, die saw is performed to complete a three-dimensional system-on-chip.

Figure 2:
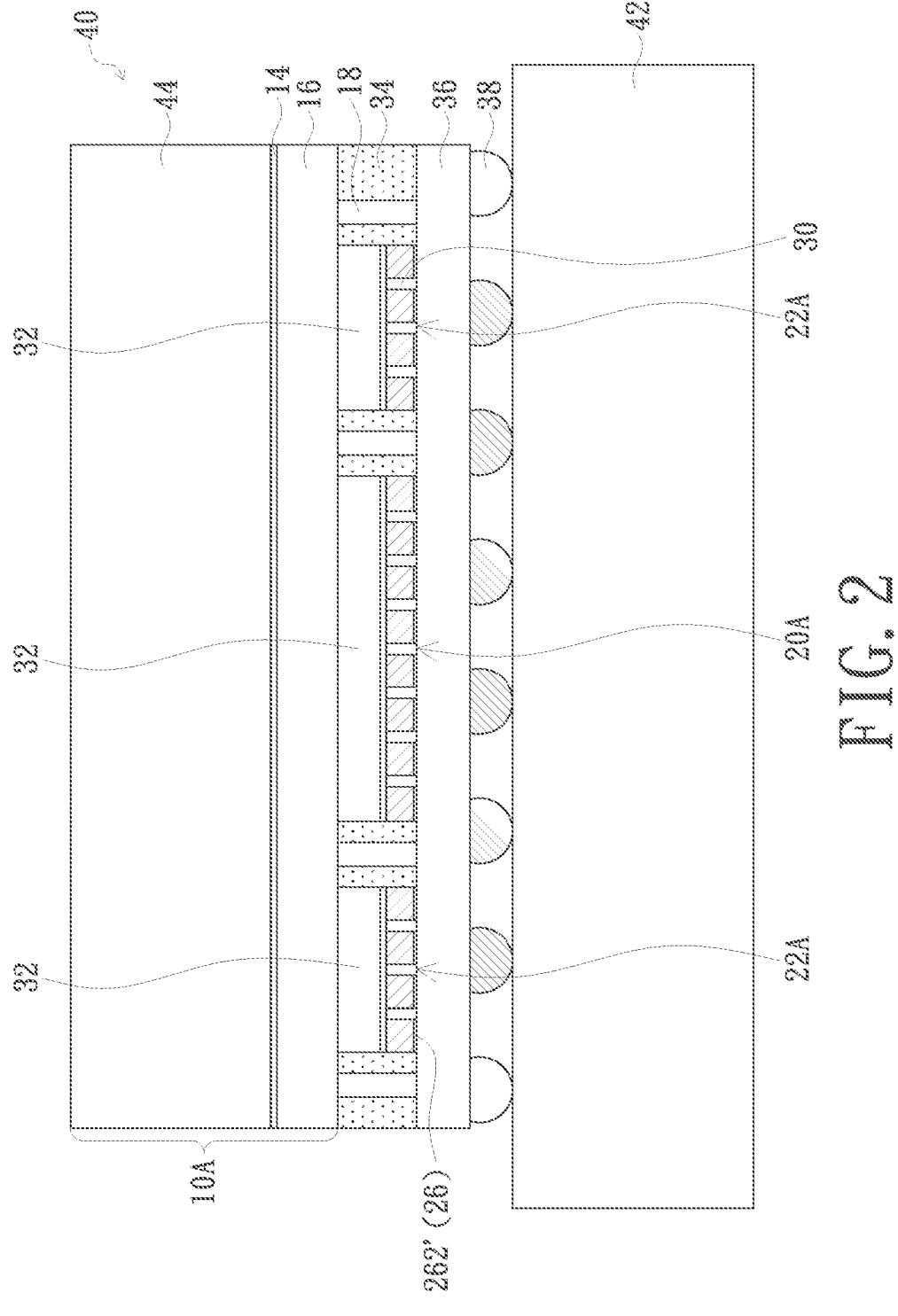
FIG. 2 is a schematic cross-sectional structure view of a three-dimensional system-on-chip, according to a first embodiment of the present invention.

FIG. 2 is a schematic cross-sectional structure view of a three-dimensional system-on-chip according to a first embodiment of the present invention, and FIG. 2 further illustrates that a three-dimensional system-on-chip 40 is disposed on a circuit board 42 or a flexible board, so as to be electrically connected to the circuit board 42 or the flexible board by the solder balls 38. As shown in FIG. 2, the three-dimensional system-on-chip 40 includes a memory chip structure 10A, a plurality of first conductive structures 18, a core die 20A, a plurality of I/O dies 22A, a dielectric layer 34, a third redistribution layer 36, and a plurality of solder balls 38. The memory chip structure 10A is a form of the above-mentioned memory wafer structure 10 (shown in FIG. 1A) after die saw. In an embodiment, the memory chip structure 10A includes a semiconductor substrate 44, a first active layer 14 and a first redistribution layer 16, the first active layer 14 are formed on the semiconductor substrate 44, and the first redistribution layer 16 is formed on the first active layer 14. The first conductive structures 18, the core die 20A, and the I/O dies 22A are disposed on the first redistribution layer 16, where the I/O dies 22A are disposed around the core die 20A, and the first conductive structures 18 is between the I/O dies 22A and the core die 20A. The structures of the core die 20A and the I/O dies 22A have been described above, and will not be repeated here. The second redistribution layer 32 of the core die structure 20A and the I/O dies 22A is bonded to the first redistribution layer 16; the dielectric layer 34 is filled between the core die 20A, the I/O dies 22A, and the first conductive structures 18, and exposes the remaining second stop layer 262' of the stop layer structure 26 and an end of the second conductive structures 30; the third redistribution layer 36 is formed on the dielectric layer 34 and the remaining second stop layer 262', and the third redistribution layer 36 is electrically connected to the exposed first conductive structures 18 and the exposed second conductive structures 30; the solder balls 38 are formed on the third redistribution layer 36.

Figure 3:
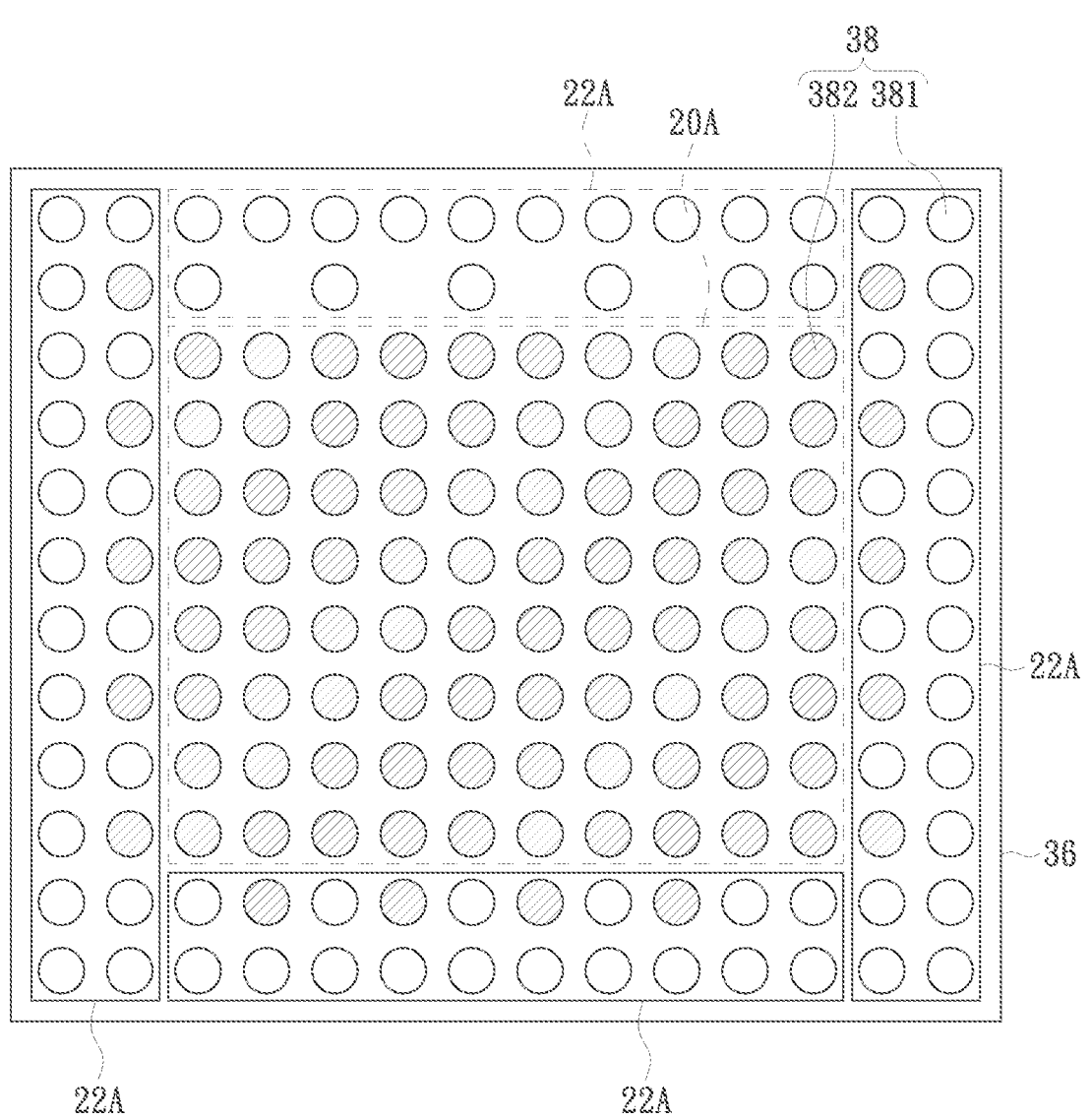
FIG. 3 is a schematic bottom view of a three-dimensional system-on-chip, according to an embodiment of the present invention.

FIG. 3 is a schematic bottom view of a three-dimensional system-on-chip according to an embodiment of the present invention, that is, a view from the side of solder balls. As shown in FIG. 3, a plurality of solder balls 38 are arranged on the third redistribution layer 36. In FIG. 3, the position configurations of the core die 20A and the I/O dies 22A are indicated by dotted lines, where the I/O dies 22A are located around the core die 20A. In an embodiment, the solder balls 38 may include signal solder balls 381 and power/ground solder balls 382, and a part of the power/ground solder balls 382 can be used to provide power or ground for the core die 20A and the I/O dies 22A, a part of the power/ground solder balls 382 can also be used to provide power or ground for the memory chip structure 10A through the third redistribution layer 36 and the first conductive structures 18, and a part of the signal solder balls 381 can be used as a signal I/O medium for the I/O dies 22A, where the signal of the I/O dies 22A can be, for example, from the core die 20A and/or the circuit board 42, and there is an access mechanism such as L3 cache between the core die 20A and the memory chip structure 10A.

Figure 4A:
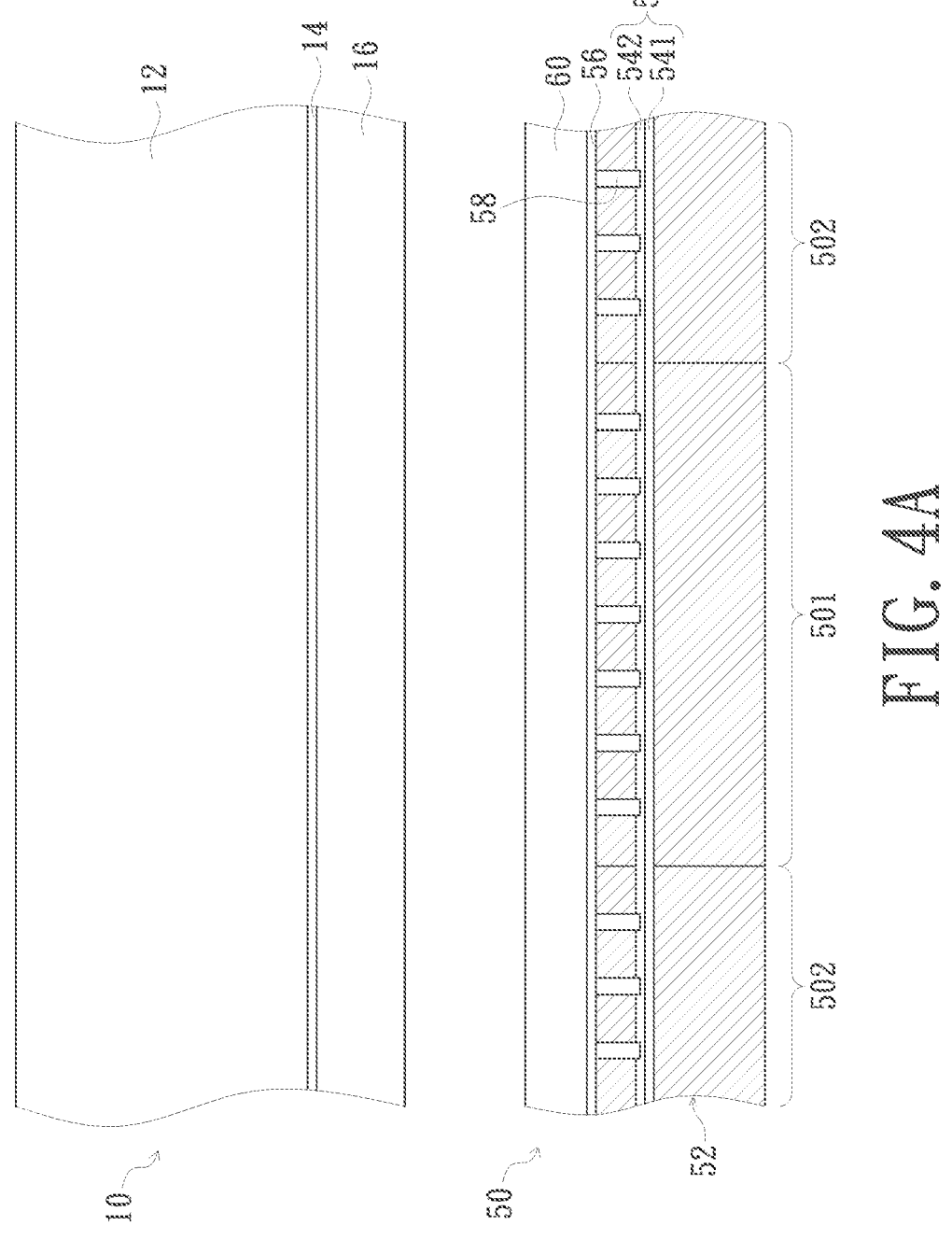
FIG. 4A to FIG. 4E are schematic cross-sectional views of a method of manufacturing a three-dimensional system-on-chip, according to a third embodiment of the present invention.

FIG. 4A to FIG. 4E are schematic cross-sectional views of a method of manufacturing a three-dimensional system-on-chip according to a third embodiment of the present invention. As shown in FIG. 4A, a memory wafer structure 10 and an SoC wafer structure 50 are provided. The memory wafer structure 10 includes a wafer 12, a first active layer 14 and a first redistribution layer 16, wherein the first active layer 14 is formed on the wafer 12 and the first redistribution layer 16 is formed on the first active layer 14, and the further features of the memory wafer structure 10 have been disclosed in the first embodiment, and will not be repeated here.

The SoC wafer structure 50 is divided into an independent core die area 501 and a plurality of I/O die areas 502, the I/O die areas 502 are disposed around the core die area 501, the SoC wafer structure 50 includes a semiconductor wafer 52, a stop layer structure 54, a second active layer 56, a plurality of conductive structures 58, and a second redistribution layer 60, and the structure and configuration of the SoC wafer structure 50 have been disclosed in the second embodiment, and will not be repeated here.

Figure 4B:
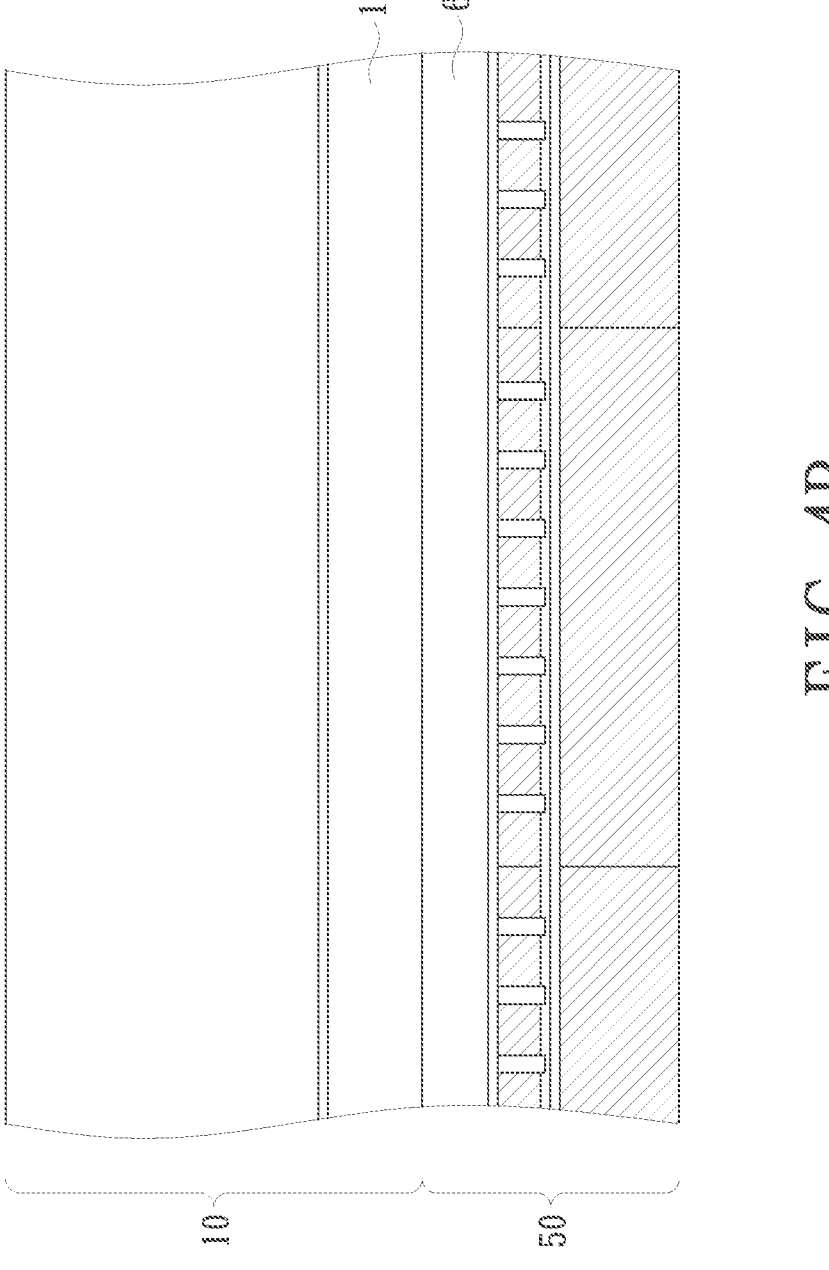
Figure 4C:
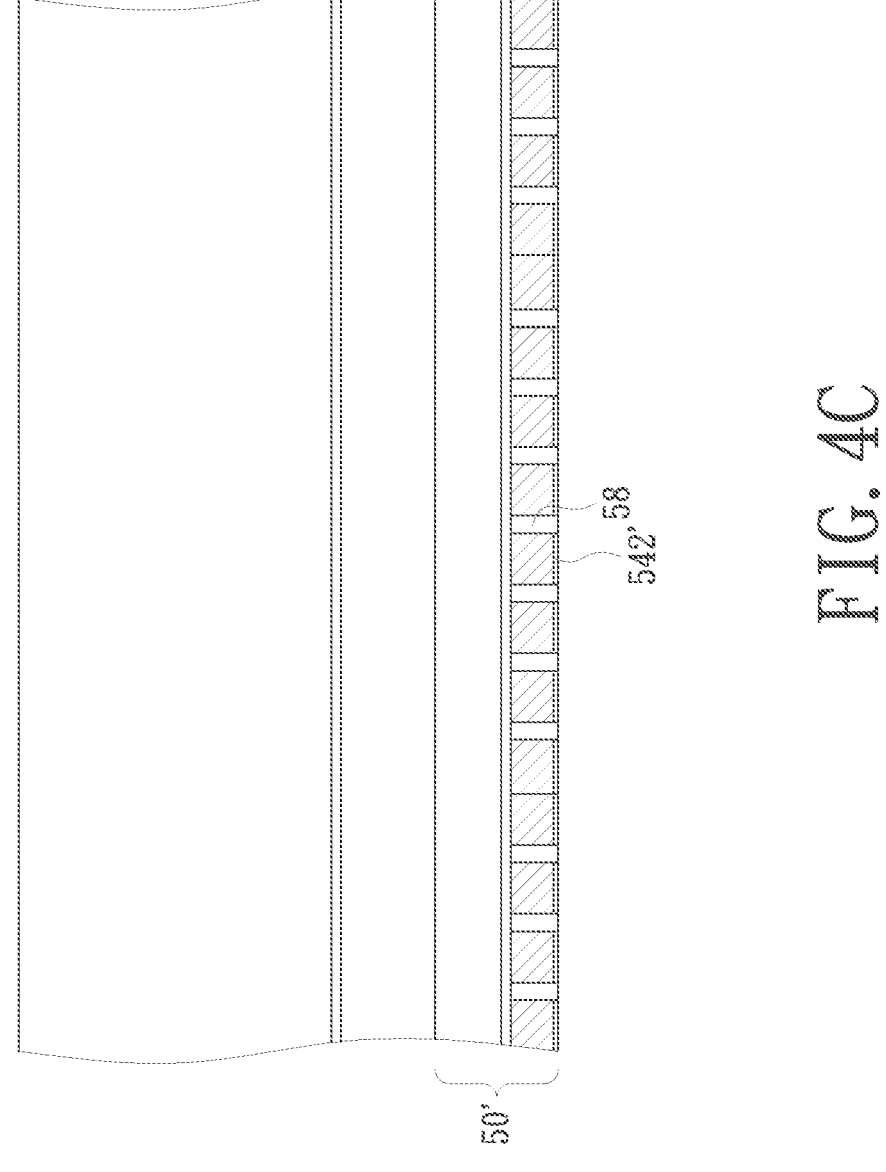

As shown in FIG. 4B, the first redistribution layer 16 of the memory wafer structure 10 is bonded to the second redistribution layer 60 of the SoC wafer structure 50; then a backside grinding process and a thinning process are sequentially performed on the SoC wafer structure 50, as shown in FIG. 4C, so as to expose an end of each conductive structure 58 and leave a very thin second stop layer 542', where the backside grinding process and the thinning process have been disclosed in the second embodiment, and will not be repeated here.

Figure 4D:
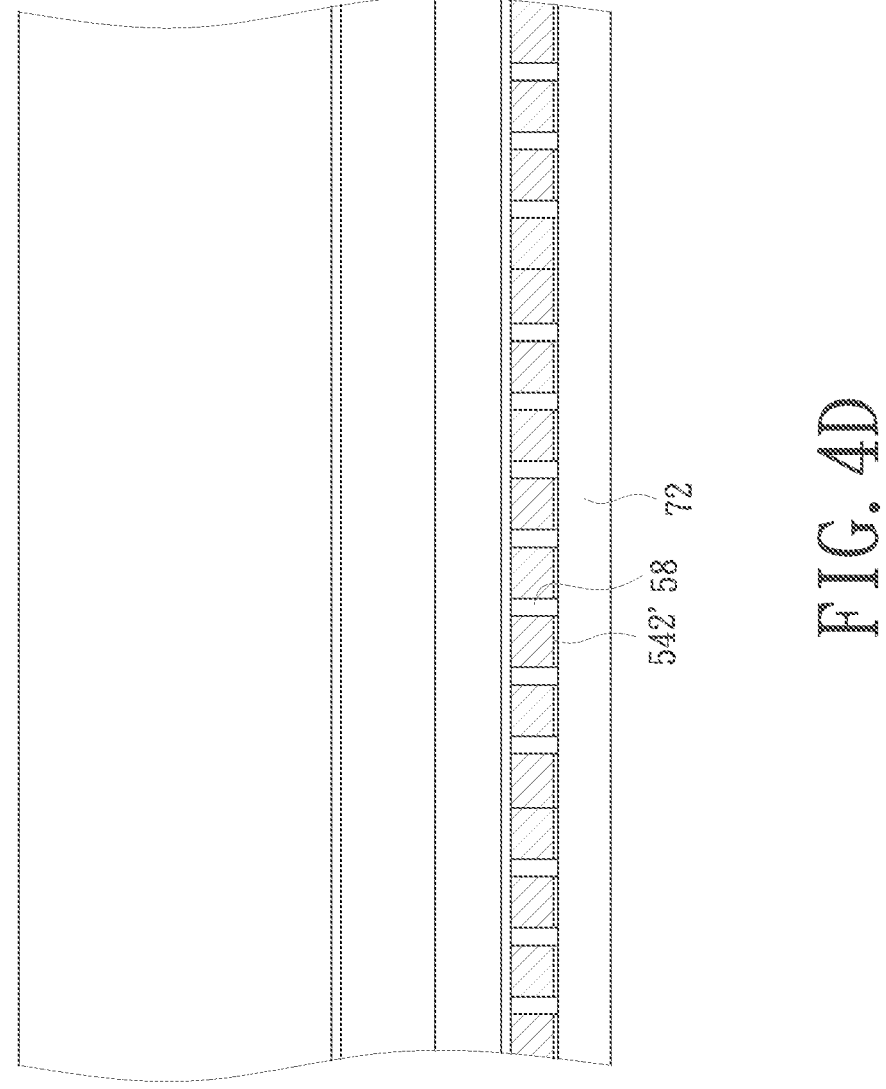
Figure 4E:
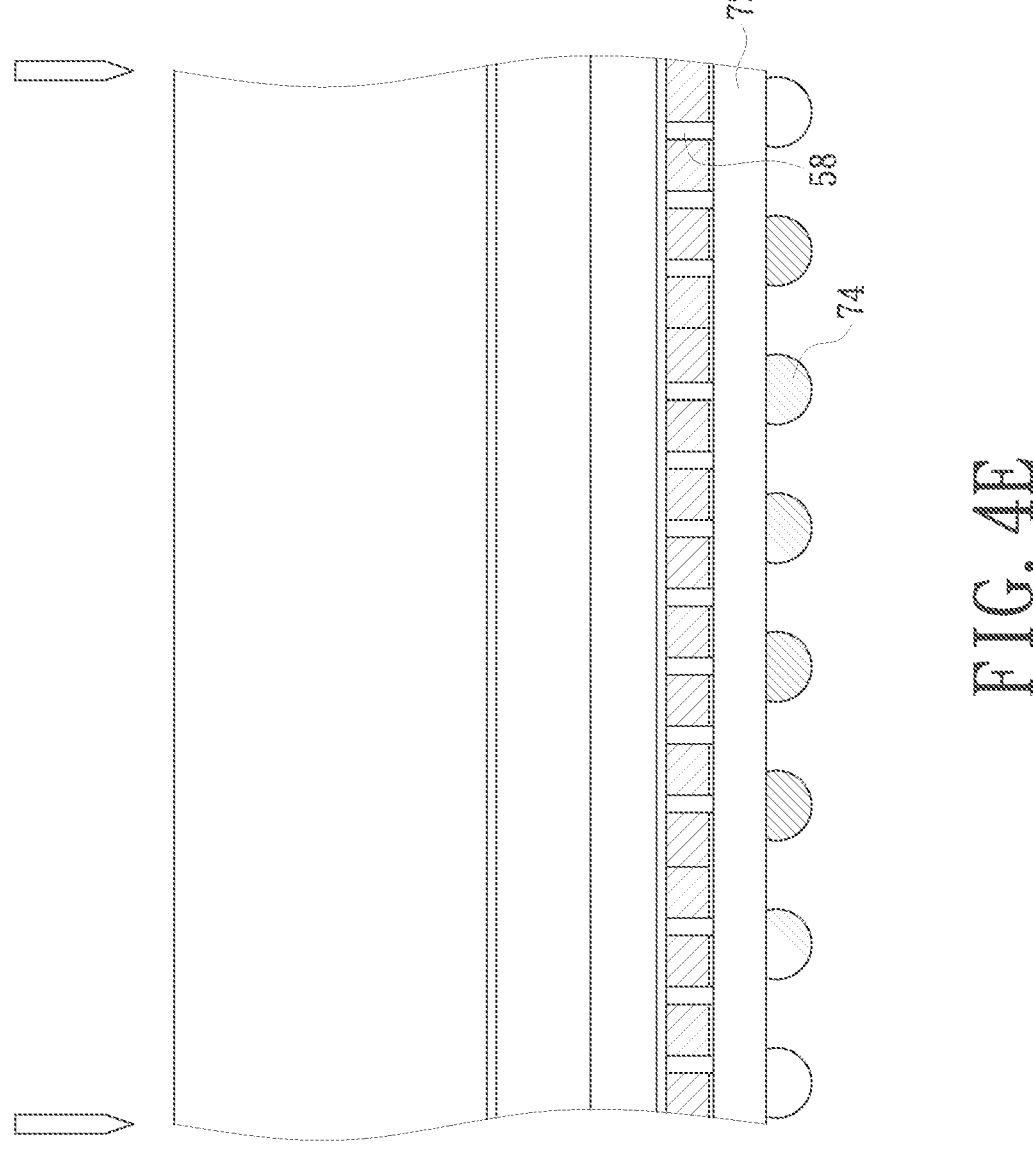

As shown in FIG. 4D, a third redistribution layer 72 is formed on the partially remaining and extremely thin second stop layer 542', and the third redistribution layer 72 is electrically connected to the exposed conductive structures 58; next, as shown in FIG. 4E, a plurality of solder balls 74 are formed on the third redistribution layer 72, and in an embodiment, the solder balls 74 are respectively electrically connected to, for example, the conductive structures 58 by the third redistribution layer 72; then, after chip probing to perform an electrical function test, die saw is performed to complete a three-dimensional system-on-chip.

Figure 5:
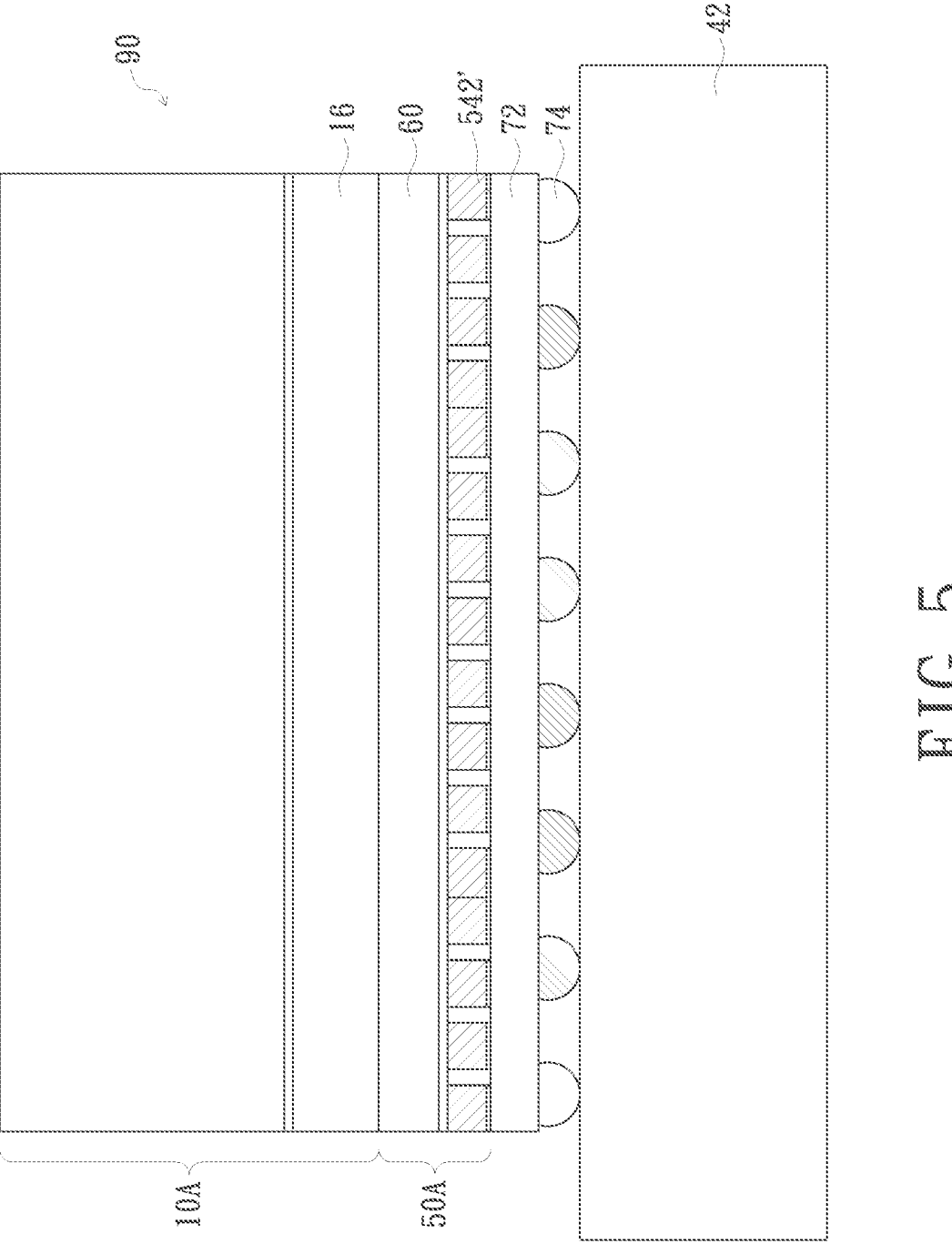
FIG. 5 is a schematic cross-sectional structure view of a three-dimensional system-on-chip, according to a third embodiment of the present invention.

FIG. 5 is a schematic cross-sectional structure view of a three-dimensional system-on-chip according to a third embodiment of the present invention, and FIG. 5 further illustrates that a three-dimensional system-on-chip 90 is disposed on a circuit board 42 or a flexible board, so as to be electrically connected to the circuit board 42 or the flexible board by the plurality of solder balls 74. As shown in FIG. 5, the three-dimensional system-on-chip 90 includes a memory chip structure 10A, an SoC chip 50A, a third redistribution layer 72, and a plurality of solder balls 74. The memory chip structure 10A is a form of the memory wafer structure 10 (shown in FIG. 4A) after die saw, and the SoC chip 50A is a form of the thinned SoC wafer structure 50' (shown in FIG. 4C) after die saw. The first redistribution layer 16 of the memory chip structure 10A and the second redistribution layer 60 of the SoC chip 50A are bonded together in a face-to-face manner. In an embodiment, the first redistribution layer 16 is bonded to the second redistribution layer 60 by a hybrid bonding technique. The third redistribution layer 72 is formed on the remaining second stop layer 542', and the third redistribution layer 72 is electrically connected to the exposed conductive structures 58; the solder balls 74 are formed on the third redistribution layer 72.

According to the above, in an embodiment of the present invention, the three-dimensional system-on-chip includes a memory chip, and a core die and a plurality of I/O dies covered by a dielectric layer, where the I/O dies are located around the core die, and the memory chip is bonded to the core die; in an embodiment of the present invention, the three-dimensional system-on-chip includes a memory chip and an SoC chip, the SoC chip includes an independent core die and a plurality of I/O dies located around the core die, and the core die is bonded to the memory chip. In the three-dimensional system-on-chip according to the embodiment of the present invention, whether it is a core die, a plurality of I/O dies, or an SoC die, it can be thinned to a very thin thickness by disposing a stop layer structure therein. For example, the overall thickness of the core die, the plurality of I/O die, or the SoC chip is not more than 12 microns, so that the overall thickness of the three-dimensional system-on-chip is greatly reduced, which can meet the requirements of high integration and speed, thus having better electrical characteristics and efficiency.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of manufacturing a three-dimensional system-on-chip, comprising:

providing a memory wafer structure, comprising a wafer, a first active layer and a first redistribution layer, the first active layer being formed on the wafer, and the first redistribution layer being formed on the first active layer;

disposing a plurality of first conductive structures, at least one core die structure, and a plurality of input/output die structures on the first redistribution layer, wherein the plurality of input/output die structures are disposed around the at least one core die structure, wherein each of the at least one core die structure and each of the plurality of input/output die structures comprise a semiconductor substrate, a stop layer structure, a second active layer, a plurality of second conductive structures, and a second redistribution layer, wherein the semiconductor substrate has opposite active side and back side, and the stop layer structure is formed in the semiconductor substrate and divides the semiconductor substrate into a first substrate part and a second substrate part, wherein the first substrate part is located between the stop layer structure and the active side, and the second substrate part is located between the stop layer structure and the back side, the second active layer is formed on the active side, the plurality of second conductive structures are formed in the first substrate part to connect the second active layer and the stop layer structure, the second redistribution layer is formed on the second active layer, and the second redistribution layer of each of the at least one core die structure and the second redistribution layer of each of the plurality of input/output die structures are directly bonded to the first redistribution layer, wherein the stop layer structure comprises a first stop layer and a second stop layer stacked on each other, a material from which the first stop layer is made is different from a material from which the second stop layer is made, the second stop layer is between the first stop layer and the second active layer, wherein the stop layer structure comprising the first stop layer and the second stop layer is a planar structure, wherein steps of forming the first stop layer and the second stop layer comprise first performing a nitrogen ion implantation process at a first depth of the semiconductor substrate, then performing an oxygen ion implantation process at a second depth of the semiconductor substrate, and the second depth is smaller than the first depth, and then a high temperature processing process is performed, so that the first stop layer is formed in an area of the nitrogen ion implantation, and the second stop layer is formed in an area of the oxygen ion implantation;

performing a backside grinding process of grinding from the back side of the semiconductor substrate to remove a part of the second substrate part;

performing a dielectric filling process to form a dielectric layer on the first redistribution layer, and the dielectric layer covering the at least one core die structure, the plurality of input/output die structures, and the plurality of first conductive structures;

performing a thinning process of removing a part of the dielectric layer, a remaining part of the second substrate part, and a part of the stop layer structure to expose the plurality of first conductive structures and the plurality of second conductive structures;

forming a third redistribution layer on the dielectric layer, the third redistribution layer being electrically connected to the exposed plurality of first conductive structures and the exposed plurality of second conductive structures;

forming a plurality of solder balls on the third redistribution layer; and performing die saw.

2. The method of manufacturing the three-dimensional system-on-chip according to claim 1, wherein during the thinning process, the step of removing a part of the stop layer structure comprises first removing the first stop layer, and then removing a part of the second stop layer.

3. The method of manufacturing the three-dimensional system-on-chip according to claim 1, wherein the first stop layer is a silicon nitride layer, and the second stop layer is a silicon dioxide layer.

4. The method of manufacturing the three-dimensional system-on-chip according to claim 3, wherein a method of removing the silicon nitride layer and the silicon dioxide layer is selected from one of chemical mechanical polishing and plasma dry etching, wherein a selection ratio of silicon nitride and silicon dioxide is between 10 and 20, and a selection ratio of silicon dioxide and silicon is about 5.

5. The method of manufacturing the three-dimensional system-on-chip according to claim 1, wherein the thinning process comprises:

a first removing step of removing a part of the dielectric layer and a remaining part of the second substrate part; and a second removing step of removing a part of the stop layer structure to expose the plurality of second conductive structures.

6. The method of manufacturing the three-dimensional system-on-chip according to claim 5, wherein the first removing step is selected from one of chemical mechanical polishing, wet etching and plasma dry etching, and the second removing step is selected from one of chemical mechanical polishing and plasma dry etching.

7. The method of manufacturing the three-dimensional system-on-chip according to claim 1, wherein the second redistribution layer is bonded to the first redistribution layer by a hybrid bonding technique.

8. A three-dimensional system-on-chip, comprising:

a memory chip structure, comprising a semiconductor substrate, a first active layer and a first redistribution layer, the first active layer being formed on the semiconductor substrate, and the first redistribution layer being formed on the first active layer;

a plurality of first conductive structures, at least one core die and a plurality of input/output dies, disposed on the first redistribution layer, wherein the plurality of input/output dies are disposed around the at least one core die, wherein each of the at least one core die and each of the plurality of input/output dies comprises a substrate, a stop layer structure, a second active layer, a plurality of second conductive structures, and a second redistribution layer, the second active layer and the stop layer structure are respectively disposed on opposite sides of the substrate, the plurality of second conductive structures are formed in the substrate, an end of each of the plurality of second conductive structures is connected to the second active layer, the other end of each of the plurality of second conductive structures penetrates and is exposed to the stop layer structure, the second redistribution layer is formed on the second active layer, and the second redistribution layer of each of the at least one core die area and the second redistribution layer of each of the plurality of input/output dies areas are bonded to the first redistribution layer;

a dielectric layer, being filled between the at least one core die, the plurality of input/output dies, and the plurality of first conductive structures, and exposing the stop layer structure and an end of the plurality of first conductive structures;

a third redistribution layer, formed on the dielectric layer, and the third redistribution layer being electrically connected to the exposed plurality of first conductive structures and the exposed plurality of second conductive structures; and a plurality of solder balls, formed on the third redistribution layer.

9. A three-dimensional system-on-chip, comprising:

a memory chip structure, comprising a semiconductor substrate, a first active layer and a first redistribution layer, the first active layer being formed on the semiconductor substrate, and the first redistribution layer being formed on the first active layer;

an SoC chip, divided into at least one core die and a plurality of input/output dies, the plurality of input/output dies being disposed around the at least one core die, the SoC chip comprising a substrate, a stop layer structure, a second active layer, a plurality of conductive structures, and a second redistribution layer, the second active layer and the stop layer structure being respectively disposed on opposite sides of the substrate, the plurality of conductive structures being formed in the substrate, an end of each of the plurality of conductive structures being connected to the second active layer, the other end of each of the plurality of second conductive structures penetrating and being exposed to the stop layer structure, the second redistribution layer being formed on the second active layer, and the first redistribution layer of each of the plurality of memory chip structures being bonded to the second redistribution layer of the at least one core die;

a third redistribution layer, formed on the stop layer structure, and the third redistribution layer being electrically connected to the exposed plurality of conductive structures; and a plurality of solder balls, formed on the third redistribution layer.

* * * * *